US 6,639,845 B2

(12) United States Patent
Fujii et al.

(10) Patent No.: US 6,639,845 B2
(45) Date of Patent: Oct. 28, 2003

(54) DATA HOLDING CIRCUIT HAVING BACKUP FUNCTION

(75) Inventors: Taro Fujii, Tokyo (JP); Koichiro Furuta, Tokyo (JP); Masato Motomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/262,073

(22) Filed: Oct. 2, 2002

(65) Prior Publication Data
US 2003/0039141 A1 Feb. 27, 2003

Related U.S. Application Data

(62) Division of application No. 09/608,943, filed on Jun. 30, 2000, now Pat. No. 6,493,272.

(30) Foreign Application Priority Data

Jul. 2, 1999 (JP) ............................................. 11-188475

(51) Int. Cl.[7] .............................................. G11C 16/04
(52) U.S. Cl. .............................. 365/189.05; 365/189.08
(58) Field of Search ......................... 365/189.05, 189.08, 365/230.06, 230.08, 233

(56) References Cited

U.S. PATENT DOCUMENTS

| 5,583,450 | A | | 12/1996 | Trimberger et al. | |
|---|---|---|---|---|---|
| 5,600,263 | A | | 2/1997 | Trimberger et al. | |
| 5,629,637 | A | | 5/1997 | Trimberger et al. | |
| 5,646,545 | A | | 7/1997 | Trimberger et al. | |
| 5,757,702 | A | * | 5/1998 | Iwata et al. | 365/189.05 |
| 5,859,800 | A | * | 1/1999 | Ueda et al. | 365/189.05 |
| 6,477,097 | B2 | * | 11/2002 | Inoue | 365/203 |
| 2002/0060703 | A1 | * | 5/2002 | Tsukata | 347/5 |

FOREIGN PATENT DOCUMENTS

| JP | 64-24504 | 1/1989 |
|---|---|---|
| JP | 4-367120 | 12/1992 |
| JP | 5-67395 | 3/1993 |
| JP | 6-97814 | 4/1994 |
| JP | 6-230845 | 8/1994 |
| JP | 7-154228 | 6/1995 |
| JP | 8-191234 | 7/1996 |
| JP | 8-330935 | 12/1996 |
| JP | 8-330945 | 12/1996 |
| JP | 9-231755 | 9/1997 |
| JP | 10-93423 | 4/1998 |
| JP | 10-112640 | 4/1998 |
| JP | 11-74360 | 3/1999 |
| JP | 11-120154 | 4/1999 |
| JP | 11-205125 | 7/1999 |

* cited by examiner

Primary Examiner—Anh Phung
(74) Attorney, Agent, or Firm—Dickstein, Shapiro, Morin & Oshinsky, LLP.

(57) ABSTRACT

A data holding circuit that retreats and restore internal statuses. The data holding portion includes a data holding portion 11 and a memory 10. At least one internal state of the data holding portion 11 is retreated via a retreating signal line 16 to the memory 10, while being restored via the memory 10 through the restoration signal line 15.

19 Claims, 9 Drawing Sheets

8: DATA HOLDING CIRCUITS HAVING A BACKUP MECHANISM

DATA HOLDING CIRCUIT HAVING BACKUP FUNCTION

This is a Divisional Application of U.S. patent application Ser. No. 09/608,943 filed on Jun. 30, 2000, now U.S. Pat. No. 6,493,272 issued on Dec. 10, 2002.

FIELD OF THE INVENTION

This invention relates to a semiconductor integrated circuit and, more particularly, to a data holding circuit.

BACKGROUND OF THE INVENTION

A programmable logic LSI (large-scale integrated circuit), exemplified in particular by FPGA (field programmable gate array)/PLD (programmable logic device) is such an LSI which holds in its inside the configuration information specifying how the hardware is to be constructed and which is designed to implement the desired hardware in accordance with commands by this configuration information.

Recently, with the Progress in the semiconductor manufacturing technology, the hardware that can be implemented by the programmable LSI is increasing in scale and, in keeping up therewith, substitution of the programmable LSI for the gate array LSI is proceeding.

Also, in the following U.S. patents:
literature (1): (U.S. Pat. No. 5,583,450, "Sequencer for A Time MultiPlexed Programmable Logic Device");
literature (2): (U.S. Pat. No. 5,600,263. "Configuration Modes for A Time Multiplexed Programmable Logic Device");
literature (3): (U.S. Pat. No. 5,629,637, "Method of Time Multiplexing a Programmable Logic Device") and
literature (4): (U.S. Pat. No. 5,646,545, "Time Multiplexed Programmable Logic Device"; all Trimberger et al., owned by Xilinx Inc., U.S.A., there is disclosed a method for time multiplexing a programmable Logic LSI.

SUMMARY OF THE DISCLOSURE

However, there is much to be desired in the aforementioned art, which is discussed hereinbelow.

In the above publications, there is not disclosed means for storing an internal state of each of plural circuit configurations when these circuit configurations are used in a switching fashion on the same hardware.

If the internal sates of the respective configurations are not stored it becomes necessary to-perform an inherently unnecessary processing of activating a circuit until the internal state to re-initiate the processing is restored after a given circuit configuration is switched to another circuit configuration and reversion is again made to the first-stated circuit configuration.

For example, if plural stages of pipeline processing circuits are involved, it is necessary to start the operation as from the processing several cycles before a time point of switching the circuit configuration so that the status of respective stages will revert to a status which allows for re-initiation of processing. This necessitates a mechanism for operating the circuit several cycles thus increasing power consumption and processing time and leading to sophistication that a designer has to construct the circuitry taking this into consideration.

If there is necessity for employing the internal status saved in a certain circuit configuration in another circuit configuration, it was necessary to construct an internal memory circuit for saving the internal status to read out the internal status subsequently.

It is therefore an object of the present invention to provide a data holding circuit adapted for retreating and restoring the internal status.

It is another object of the present invention to provide a data holding circuit in which a circuit user is able to retreat and restore the internal status automatically without being conscious about such retreating or restoration.

It is still another object of the present invention to provide a data holding circuit in which the internal status can be retreated and restored only when such retreating or restoration is desired by the circuit user.

It is a further object of the present invention to provide a data holding circuit in which the sites in the memory portion or unit for data retreating or restoration can be determined automatically.

It is yet another object of the present invent ion to provide a data holding circuit in which it is possible to restore internal status selectively from the retreated internal status. Other objects of the present invention will become readily apparent from the following description and the claims.

According to a first aspect of the present invention, there is provided a data holding circuit having a data holding portion and a memory portion wherein at least one internal status of the data holding portion is retreated to the memory portion and wherein the internal status retreated to the memory portion is restored from the memory portion to the data holding portion.

According to a second aspect of the present invention, there is provided a data holding circuit having a data holding portion holding one-bit data and a memory portion
wherein at least one internal status of the data holding portion is retreated to the memory portion and the internal status retreated to the memory portion is restored from the memory portion to the data holding portion.

According to a third aspect of the present invention, a data holding circuit includes a data holding portion comprised of a flipflop circuit and a memory potion.

According to a fourth aspect of the present invention, there is provided a data holding circuit having a data holding port ion comprised of a flipflop circuit and a memory portion, wherein
a state of a flipflop on a master side or a flipflop on a slave side is retreated to the memory portion and
a state retreated to the memory portion is restored from the memory portion to the data holding portion.

According to a fifth aspect of the present invention, a data holding circuit has a data holding portion comprised of a latch circuit and a memory portion.

According to a sixth aspect of the present invention, a data holding circuit has a data holding portion holding data of plural bits and a multi-port memory portion.

According to a seventh aspect of the present invention, a data holding circuit has a non-synchronous data holding portion and memory portion.

According to an eighth aspect of the present invention, a data holding circuit in the first to seventh aspects includes a circuit unit (or means for) automatically determining storage elements constituting the memory port ion depending on the status of a circuitry including the data holding portion.

According to a ninth aspect of the present invention, the data holding circuit in the first to seventh aspects includes a circuit unit (or means) for automatically determining storage elements constituting the memory portion depending on changes in the structure of a circuitry including the data holding circuit.

According to a tenth aspect of the present invention, the data holding circuit in the first to seventh aspects includes a circuit unit (or means) for retreating the internal status to the memory portion at a time point when the retreating of the internal status of the data holding portion is necessary.

According to an eleventh aspect of the present invention, the data holding circuit in the first to seventh aspects includes a circuit module (or means) for restoring the internal status from the memory portion at a time point when the restoration of the internal status of the data holding portion is necessary.

According to a twelfth aspect of the present invention, the data holding circuit in the first to seventh aspects includes a circuit module (or means) for selecting whether or not the retreating of the internal status of the data holding portion to the memory portion or restoration from the memory portion is to be made.

According to a thirteenth aspect of the present invention, the data holding circuit in the first to seventh aspects includes a circuit module (or means) for retreating the internal status of the data holding portion to the memory portion in synchronism with clock signals and for restoring the internal status retreated to the memory portion to the data holding portion.

According to the fourteenth aspect of the present invention, in the data holding circuit in the preceding aspects control is performed so that a restoration operation from the memory portion and retreating to the memory portion will occur in the high and low status of the clock signals, respectively.

According to a fifteenth aspect of the present invention in the data holding circuit of the first to seventh aspects control is performed so that the restoration operation from the memory portion and retreating to the memory portion is caused to occur from cycle to cycle.

According to a sixteenth aspect of the present invention in the data holding circuit of the first to seventh aspects includes a circuit module (or means) for performing control so that the internal status of the data holding port ion is retreated to the memory potion and for restoring the internal status retreated to the memory potion to the data holding portion only when the retreating and restoration operations are necessary.

According to a seventeenth aspect of the present invention, the data holding circuit of the first to seventh aspects includes a circuit unit (or means) for selecting, from the memory potion, an internal state to be restored to the data holding portion among the internal states retreated to the memory potion.

According to an eighteenth aspect of the present invention, the data holding circuit of the first to seventh aspects includes a circuit module (or means) for restoring the internal status retreated to the memory potion to a data holding portion distinct from the data holding portion to which the data has been retreated.

According to a nineteenth aspect of the present invention, the data holding circuit of the first to seventh aspects data is previously written in the memory potion, wherein the data stored in the memory potion is set in the data holding portion on startup of operation of the data holding circuit and on modifying a portion in use of the memory potion to determine an initial output value.

Further aspects of the present invention will become apparent from the entire disclosure including the embodiments, claims, and drawings. Particularly, the features of set out in the claims are incorporated herein by reference thereto.

PREFERRED EMBODIMENTS OF THE INVENTION

In the following, certain preferred embodiments of the present invention are explained. In a preferred embodiment of the present invention, there is provided a data holding circuit comprising a data holding portion that holds data fed from a data input signal line and outputs the signal via a data output signal line, and a memory potion connected to an output end and an input end of the data holding portion via a retreating signal line and a restoration signal line, wherein an internal state of the data holding portion is retreated over the retreating signal line to the memory potion, and wherein the internal state retreated to the memory potion is restored over the restoration signal line to the data holding portion.

The data holding circuit according to the present invention includes a control unit performing control on retreating of the internal status of the data holding portion to the memory potion and on restoration of the internal status from the memory potion to the data holding portion.

The data holding circuit according to the present invention is constructed so that the memory potion is made up a plurality of storage elements, the internal state of the data holding portion is written in that storage element of the storage elements selected by an input selection signal and so that the internal state read out from the storage element of the plural storage elements as selected by the selection signal is restored to the data holding portion.

Figure 2:
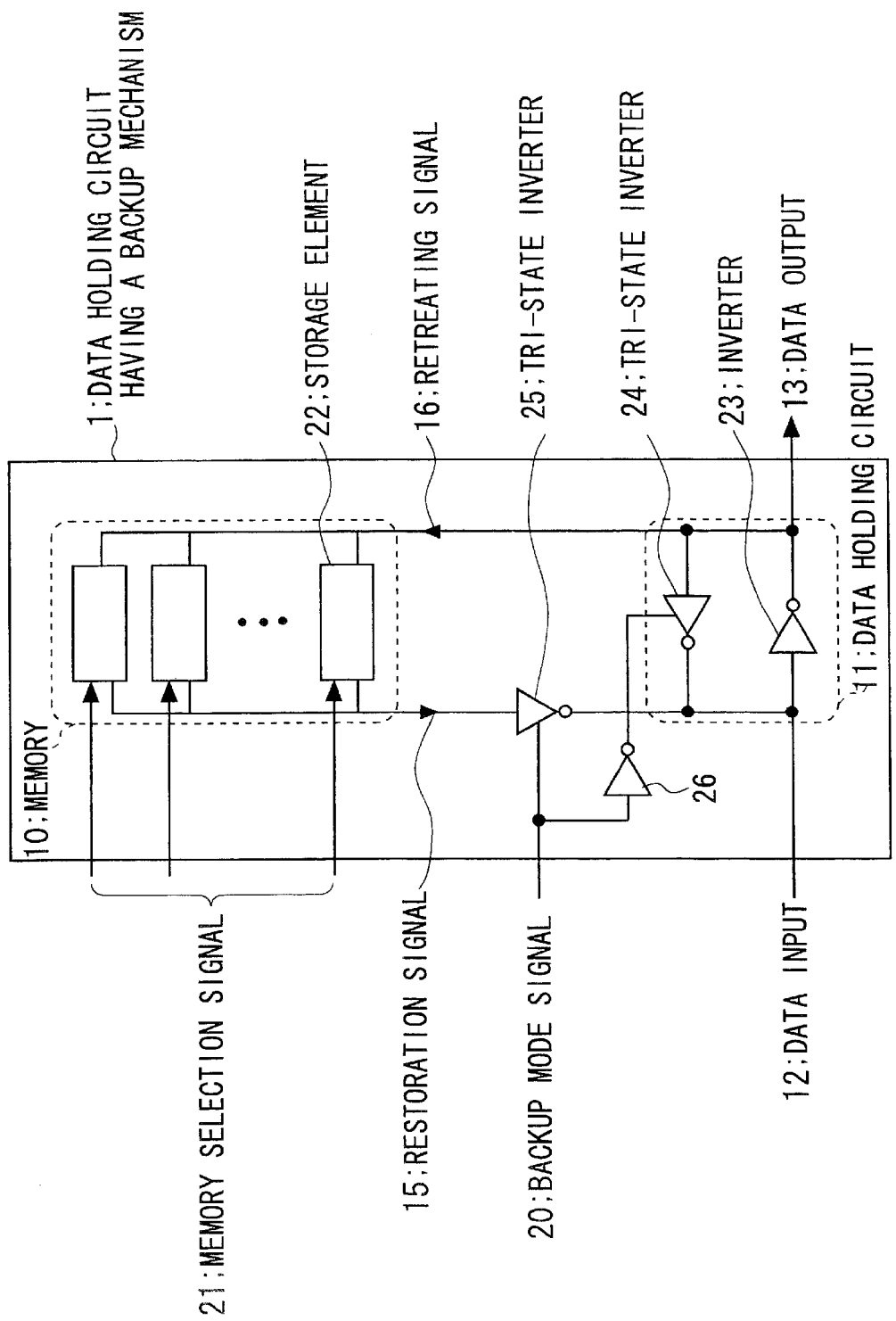
FIG. 2 shows a circuit structure of a second embodiment of the present invention.

In another preferred embodiment of the present invention, shown in FIG. 2, there is provided a semiconductor integrated circuit including a data holding portion (11) having a first inverter (23), fed at its input end with a data input signal and outputting a data output signal at its output end, and a second inverter (24) having its input end connected to the output end of the first inverter and having its output end connected to the input end of the first inverter, the second inverter being on/off controlled by a value of a backup mode signal (20), and a memory potion (10) having a plurality of storage elements. The output end of the first inverter (23) of the data holding portion (11) is connected to the memory potion over a retreating signal line (16). The input end of the first inverter (23) of the data holding portion (11) and the memory potion (10) are connected by a restoration signal line (15) via a third inverter (25) on/off controlled by the backup mode signal (20). The third inverter (25) and the second inverter (24) of the data holding portion (10) are turned off and on when the backup mode signal (20) is inactive, respectively, the first and second inverters (23, 24) of the data holding portion (10) being then in operation to hold the value of the data input signal In the data holding portion (10) to output the value as a data output signal. The second inverter (24) of the data holding portion is turned off when the backup mode signal (20) is active, the data input signal (12) fed to the first inverter (23) of the data holding portion (10) then being written in one or more of storage elements of the plural storage elements of the memory potion as selected by a selection signal (21) from the output end of the first inverter (23) through the retreating signal line (16). The value read out from a storage element of the plural storage elements as selected by the selection signal (21) is supplied to the input end of the first inverter (23) through the restoration signal line (15) and the third inverter (25) in the turned-on state. There may also be provided means for evading collision of a data input to the first inverter of the data holding portion and data read out from the memory potion. An inverter 26 is branched from the backup mode signal line (20) and connected to a control terminal of the tri-state inverter (2nd inverter) (24).

Figure 9:
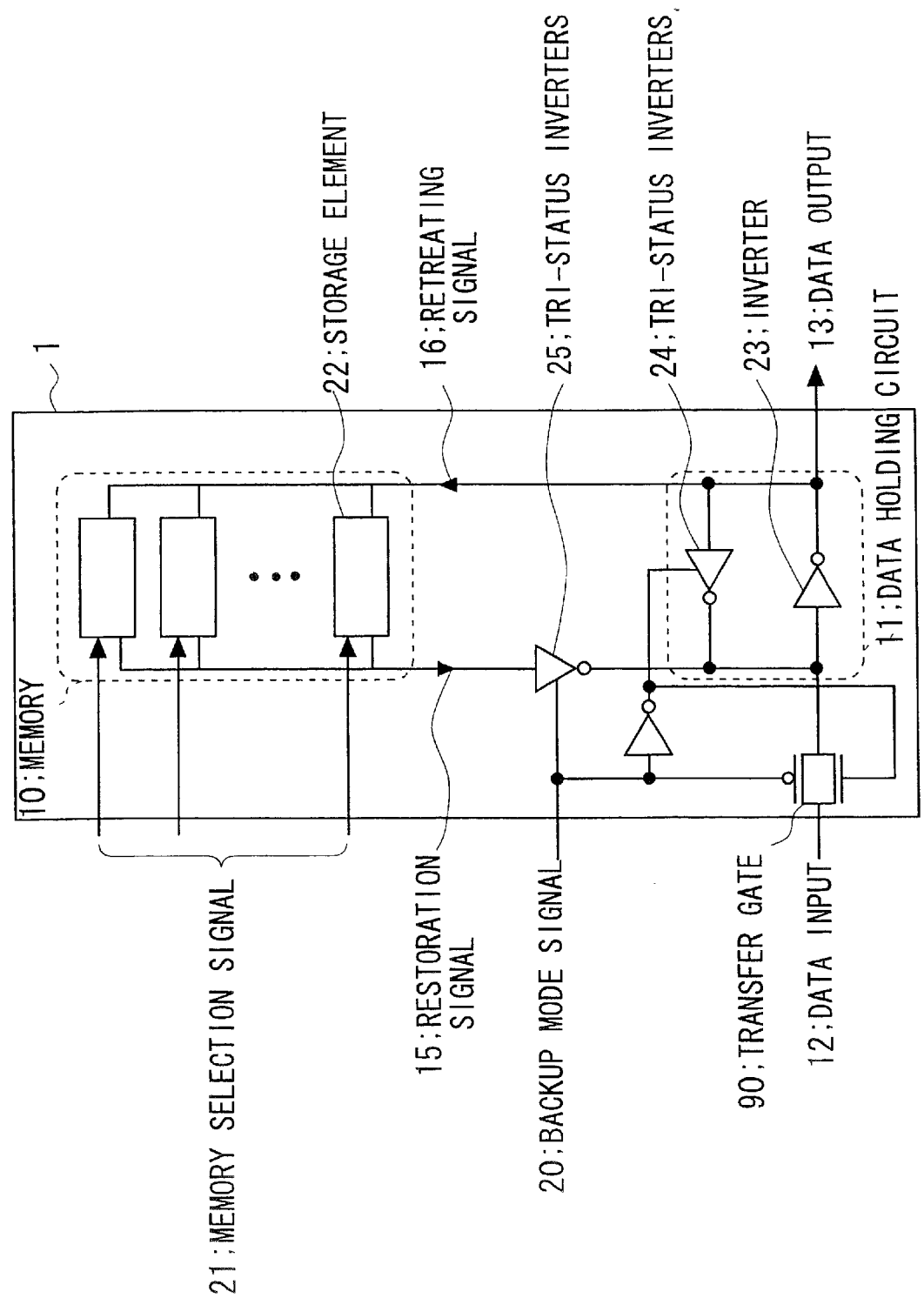
FIG. 9 shows a circuit structure of a seventh embodiment of the present invention.

In another preferred embodiment of the present invention, shown in FIG. 9, the semiconductor integrated circuit includes a transfer gate (90) receiving the data input signal as an input and which is turned on when the backup mode signal (20) is inactive, with a junction point between an output of the transfer gate (90 in FIG. 9) and an output of the third inverter (25) being connected to an input end of the first inverter (23).

Figure 3:
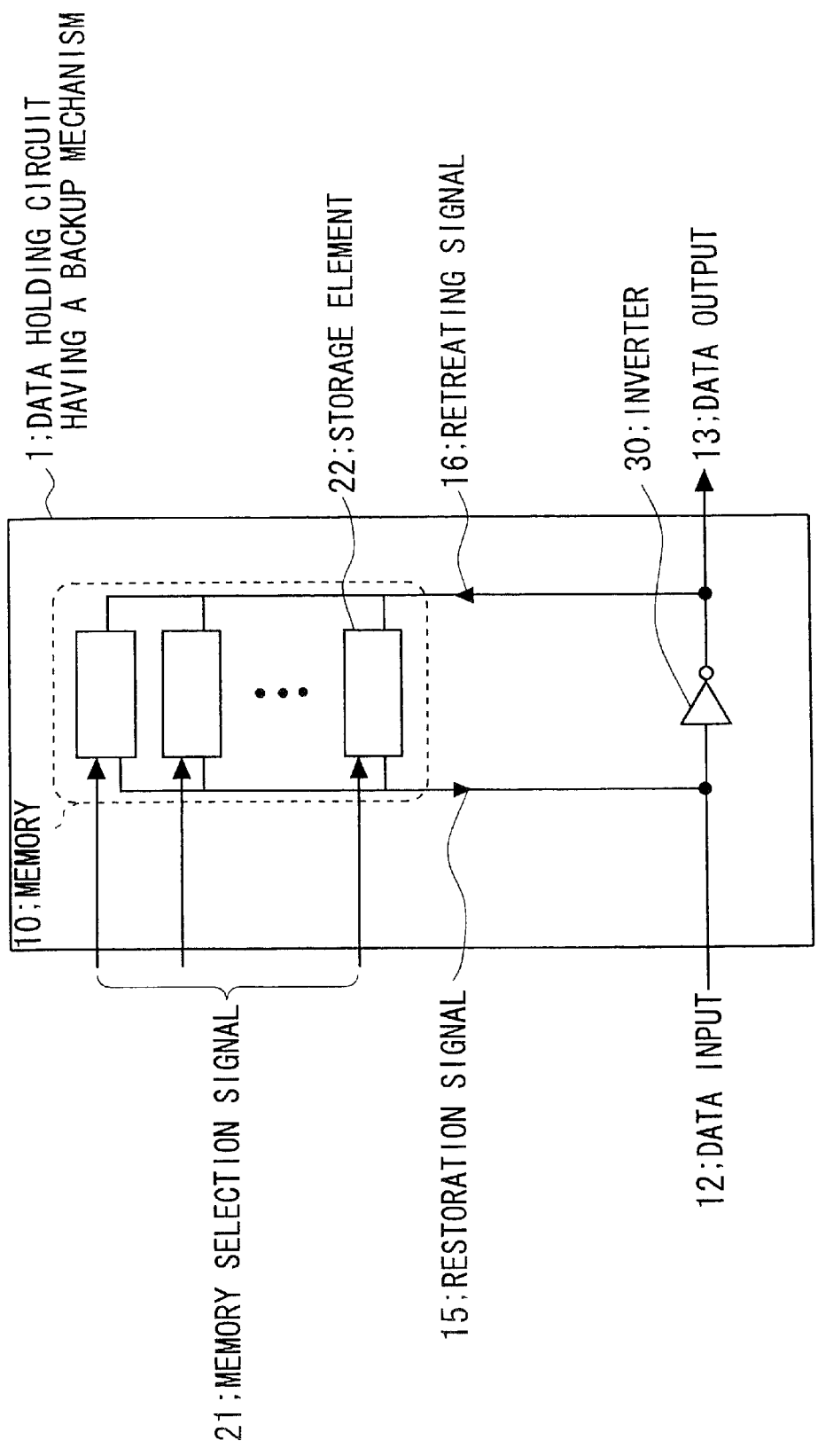
FIG. 3 shows a circuit structure of a third embodiment of the present invention.

In still another preferred embodiment of the present invent ion, shown in FIG. 3, the semi conductor integrated circuit includes a data holding portion having an inverter (30) to which a data input signal is fed at its input terminal and a data output signal is output at its output terminal, and a memory potion (10) containing a plurality of storage elements (22), an output end of the inverter (30) of the data holding portion and the memory potion (10) are interconnected over a retreating signal line (16), an input end of the inverter (30) of the data holding portion and the memory potion are interconnected over a restoration signal line (15). A data input signal, fed to the inverter (30) is routed from the output end of the inverter (30) and the retreating signal line (16) so as to be written in one or more storage elements of the memory potion as selected by a memory selection signal (21), and a value read out from the storage element of the plural storage elements as selected by the memory selection signal (21) is supplied through the restoration signal line (15) to the input end of the inverter (30) of the data holding portion.

Figure 4:
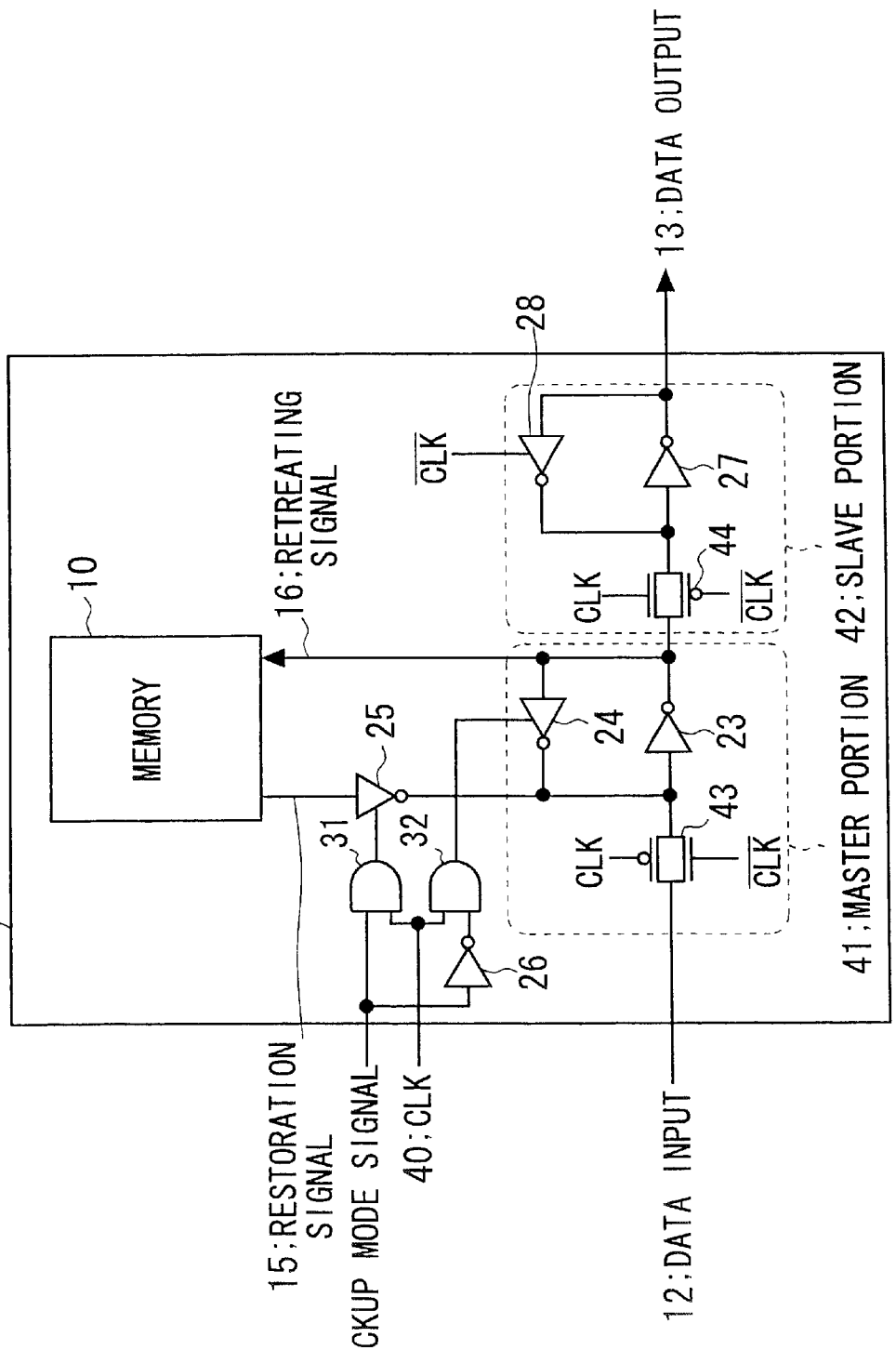
FIG. 4 shows a circuit structure of a fourth embodiment of the present invention.

In still another embodiment of the present invention, shown in FIG. 4, there is provided a semiconductor integrated circuit including a data holding portion (42) and a memory portion (10) having a plurality of storage elements (22). The data holding portion has a master/slave flipflop including a master portion (41) and a slave portion (42). The master portion (41) is made up of a first MO type transfer gate (43) which has a data input signal as an input and which is on/off controlled by a complementary clock signal pair (CLK, CLK[31]), a first inverter (23) to an input end of which is fed an output of the first transfer gate (43) and a second inverter (24) which has an input end and an output end connected to an output end and to an input end of the first inverter (23), respectively, and which is on/off controlled by a value of the backup mode signal (20) The slave portion is made up of a second transfer gate (44) having an output of the first inverter (23) of the master portion (41) as an input, the second transfer gate being on-off controlled in an opposite phase relative to the first transfer gate (43), a third inverter (27) to an input end of which an output of the second transfer gate (44) is fed, and a fourth inverter (28) an input end of which is connected to an output end of the third inverter (27) and an output end of which is connected to an input end of the third inverter (27), the fourth inverter being on-off controlled by the complementary (reverse-phase) clock signal (CLK⁻). The output end of the first inverter (23) of the master portion (41) is connected to the memory portion (10) over a retreating signal line (16), while an input end of the first inverter (23) of the data holding portion is connected to the memory potion (10) via the restoration signal line (15) and via a fifth inverter (25) on-off controlled by values of the backup mode signal (20) and a positive phase clock signal (CLK). There are provided with a circuit (31, 32) which turns on the fifth inverter (25) when the backup mode signal (20) is active and the positive-phase signal is of one of logical values. The fifth inverter (25) is turned off when the backup mode signal (20) is inactive, the first and second inverters (23, 24) of the master portion of the data holding circuit 11 being in operation to output the value of the data input from the master portion and the slave portion. The second inverter (24) of the data holding portion (master portion) is turned off when the backup mode signal (20) is active, the data input signal fed to the first inverter (23) of the master portion is written in one or more storage elements (22) selected by the selection signal (21) from an output end of the first inverter (23) through the retreating signal line (16). A value read out from a storage element of the storage elements of the memory potion selected by the selection signal (21) is routed through the restoration signal line (15) and the fifth inverter (25) turned on based on the value of the clock signal (CLK) so as to be supplied to an input end of the data holding portion (master portion).

Figure 6:
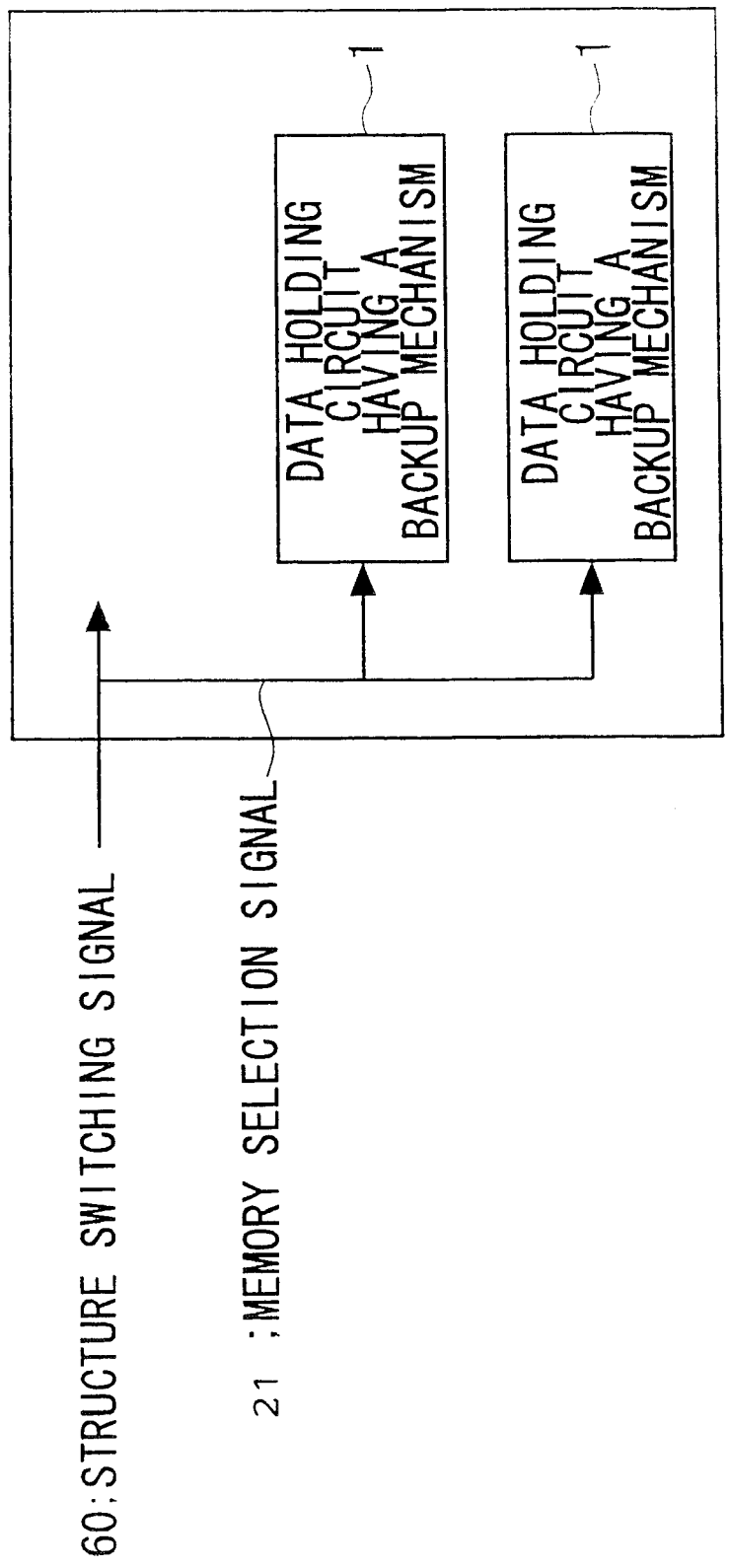
FIG. 6 shows a circuit structure of a fifth embodiment of the present invention.

In still another embodiment of the present invention, shown ion FIG. 6, a structure switching signal indicating changes in the circuit configuration is used as a memory selection signal of the memory potion, wherein data of the data holding portion is automatically retreated to the inside of the memory potion in synchronism with changes in the circuit configuration, with data read out from the memory potion being restored to the data holding portion as necessary.

Figure 8:
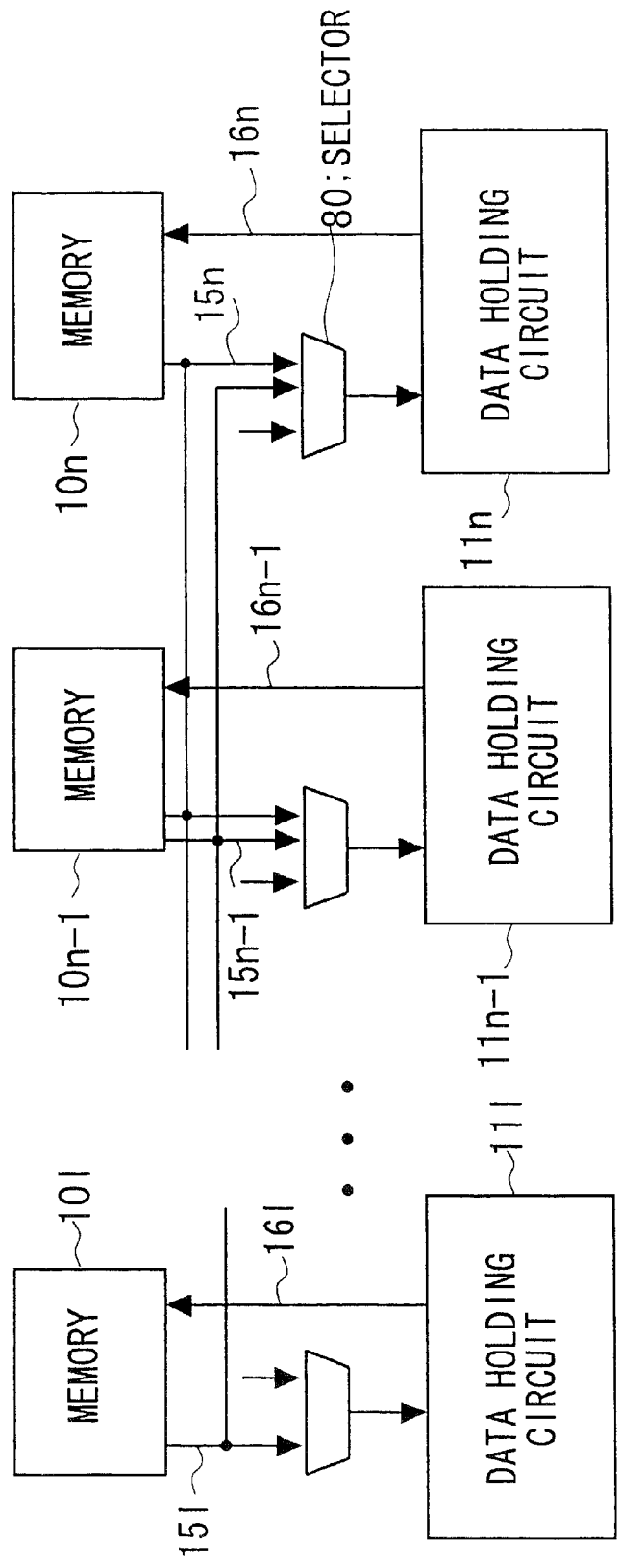
FIG. 8 shows a circuit structure of a sixth embodiment of the present invention.

In yet another embodiment of the present invention, shown in FIG. 8, a plurality of (n) data holding portions are provided, an output of each data holding portion being connected to the memory potion (10) (101 to 10n) corresponding to the data holding portion (111 to 11n) by a retreating signal line (16) (161 to 16n). A selector (80) is provided at an restoration signal inputting stage to the data holding portion, the selector being connected to any branch line from the restoration signal lines (e.g. , . . . $10_{n-1}$, 10n) from other memory potions to the other data holding Portions in addition to the restoration signal line (15) (e.g., 15) from the memory potion (10) (e.g., 101) associated with the data holding portion, data to be restored to the data holding portion being selected by the selector (80).

Preferred Embodiments

For illustrating the above-described embodiments in further detail, preferred embodiments of the present invention will be explained with reference to the drawings.

Figure 1:
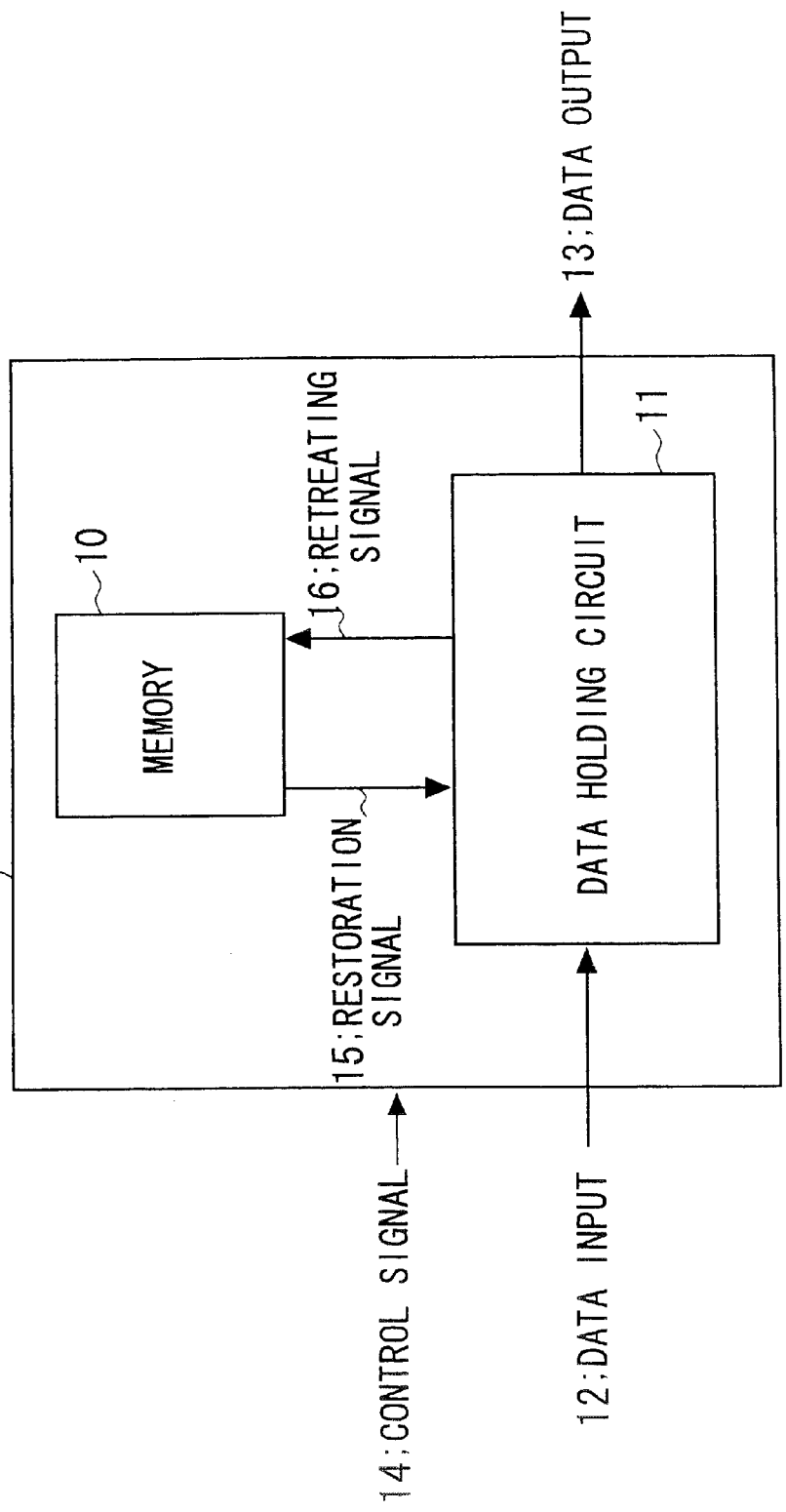
FIG. 1 is a block diagram showing a basic structure of an embodiment of a data holding circuit having a backup mechanism according to the present invention.

The basic configuration of the present invention will be explained with reference to the drawings as a first embodiment of the invention. FIG. 1 shows the basic structure of a first embodiment of a data holding circuit having a backup mechanism according to the present invention. Referring to FIG. 1, a data holding circuit having a backup mechanism 1 includes a data holding circuit 11 and a memory 10 connected to the data holding circuit 11 through a retreating signal line 16 and a restoration signal line 15. The data holding circuit 11 has a data inputting signal line 12 and a data outputting signal line 13 and holds an input signal fed from the data inputting signal line 12 whereas outputting the signal at the data outputting signal line 13.

A control signal line 14 is a signal line to which is fed a control signal used for controlling valid/invalid of a backup mechanism and the retreating as well as restoration in the memory 10.

Although the retreating signal line 16 and the restoration signal line 15 are shown separately, these may also be unified by a bidirectional signal line.

A second embodiment of the present invention is hereinafter explained. FIG. 2 shows an example of a circuit configuration of the data holding circuit having a backup mechanism 1 according to the present invention. Referring to FIG. 2, the data holding circuit having a backup mechanism 1 is made up of a data holding circuit 11, a memory 10 made up of plural storage elements 22 and a tri-state inverter 25 for controlling an output of a restoration signal line 15. The data holding circuit 11 is comprised of a loop by a two-stage inversion logic gate employing an inverter 23 and a tri-state inverter 24 having its input and output connected to an output and an input of the inverter 23.

The storage elements 22 write data on the retreating signal line 16 fed by the data holding circuit 11, or outputs the read-out data to the restoration signal line 15. The write and output sides of the storage elements 22 are of the same logic. The plural storage elements 22 may be selected by a memory selection signal 21.

The data holding circuit having a backup mechanism 1 has two operating modes.

During the normal operation, when a backup mode signal 20 is inactive (low level), the tri-state inverter 24, fed with a signal corresponding to the backup mode signal 20 complemented by the inverter 26, as a control signal, is in an output-enabling state, whilst the tri-state inverter 25 is in the output disabling state, with only the inverter 23 and the tri-state inverter 24 in the data holding circuit 11 being in operation to hold a value from the data inputting signal line 12 in the data holding circuit 11 to output the value to the data outputting signal line 13.

During the backup mode, that is when the backup mode signal 20 is active, that is at a high level, the tri-state inverter 24 is turned off, such that a value from the data inputting signal line 12 is transmitted through the retreating signal line 16 on the data outputting side (13) so as to be written in one or more storage elements 22 as selected by a memory selection signal 21.

The value read out from a storage element 22 from the storage elements in the memory 10 as selected by the selection signal 21 is fed to the data inputting signal line (12) side through the restoration signal line 15 and the tri-state inverter 25. This holds the value of the data inputting signal line 12 in the data holding circuit having a backup mechanism 1, and also in the storage elements 22, as during the normal operation.

By switching the memory selection signal 21, the storage elements 22 which hold the value from the data inputting signal line 12 is changed to enable the value of the data holding circuit 11 in plural states to be held in the memory 10.

The value on the data inputting signal line 12 collides against the value of the tri-state inverter 24 or 25. Therefore, in order to constitute a circuit, a mechanism for evading collision is added to the data inputting signal line 12.

A third embodiment of the present invention is now explained. FIG. 3 shows a circuit structure of the data holding circuit having a backup mechanism 1 according to the third embodiment of the present invention. This circuit has only the backup mode as an operating mode, that is, it backups at all times, so that the value of the data inputting signal line 12 is always saved in the memory 10. In this circuit, the writing and outputting sides of the memory 10 need to be logically inverted relative to each other.

If this structure is unchanged, the value on the data inputting signal line 12 always collides against the value of the restoration signal. Therefore, if the circuit is to be constructed, there is annexed a collision evading mechanism on the data inputting signal line 12.

A fourth embodiment of the present invention is now explained. FIG. 4 shows a circuit structure of the data holding circuit having a backup mechanism 1 according to the fourth embodiment of the present invention. A backup mechanism is annexed to a master portion 41 of a flipflop circuit. If a backup mode signal 20 is of the low level, the master portion 41 and a slave portion 42 operate as an ordinary flipflop circuit. If the backup mode signal 20 is of the high level, the internal state of the master portion 41 is saved in the memory 10. As for collision between outputs of the tri-state inverters 24 and 25 with the data inputting signal line 12, a transfer gate 43 is inserted on the data inputting signal line 12 and exclusive control is performed by complementary clocks CLK, CLK⁻ 40 to evade data collision.

As a modification of the present embodiment, the slave portion 42 of the flipflop circuit may be eliminated to provide a structure comprising a latch circuit and a backup mechanism annexed thereto. Alternatively, a backup mechanism may be annexed to the slave portion 42 in place of the master portion 41 of the flipflop circuit.

As a modification of the present embodiment, there may be annexed a reset mechanism or a set mechanism to the flipflop circuit shown in FIG. 4.

Figure 5:
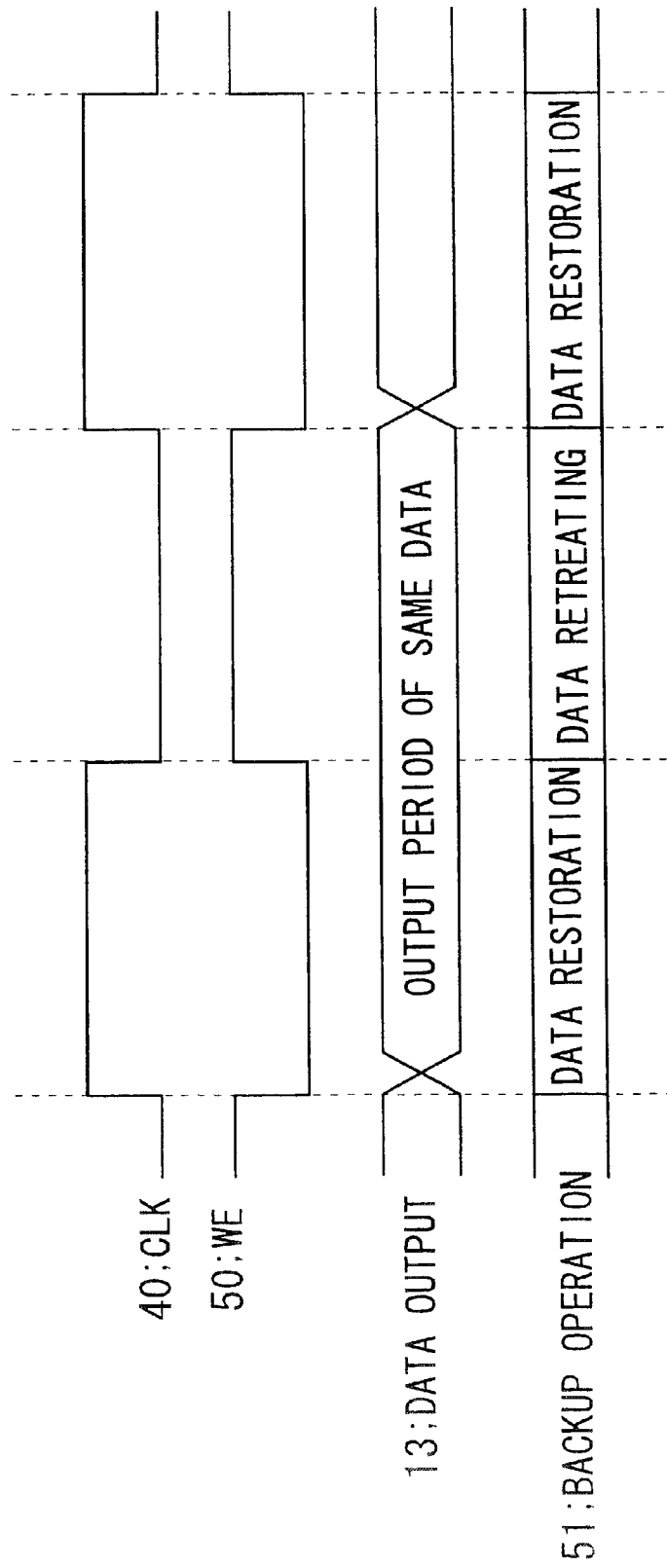
FIG. 5 is a timing chart for illustrating the operation of the fourth embodiment of the present invention.

FIG. 5 shows a timing chart showing an illustrative operating status of the data holding circuit shown in FIG. 4. Specifically, FIG. 5 shows that a write control signal to the memory 10 of FIG. 4 (WE50) is formulated using an inversion logic of the clock signals 40.

As for the data outputting signal line 13, the same data continues to be output since rising of each clock signal until rising of the next clock signal.

By way of a backup operation 51, data is restored from the memory 10 during the former half of the clock signal CLK (during the high time), while being written in the memory 10 by way of retreating during the latter half of the clock signal CLK (during the low time).

This realizes the operation that data in the flipflop directly before rise of the clock signal is stored in the memory 10 and data stored in the memory is restored to the inside of the flipflop.

A fifth embodiment of the present invention is hereinafter explained. FIG. 6 shows a block diagram showing a re-constructable circuit 6, inclusive of the data holding circuit having the backup mechanism 1, as the fifth embodiment of the present invention.

By using a structure switching signal 60, imparting structural changes of the re-constructable circuit 6, as the memory selection signal 21 of the data holding circuit having the backup mechanism 1, data on the data holding circuit 11 can be written and restored in proper places in the memory 10 automatically in synchronism with changes in the circuit structure. Moreover, by controlling the memory selection signal 21 independently of the structure switching signal 60, it is possible to perform writing/restoration using optional storage elements in the memory 10.

Figure 7:
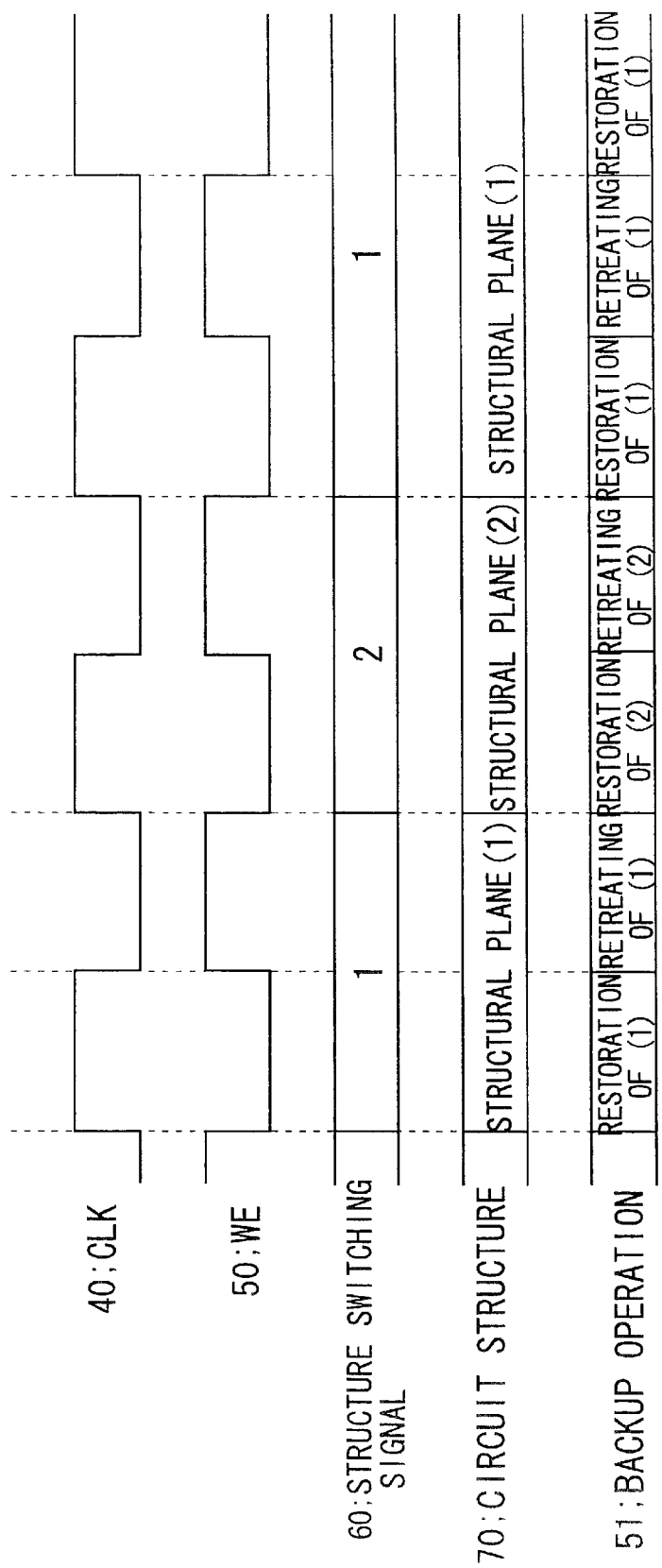
FIG. 7 is a timing chart for illustrating the operation of the fifth embodiment of the present invention.

FIG. 7 shows a timing chart showing an example of the operating status of the circuit shown in FIG. 6. The switching of the circuit structure is synchronized with the clock signals 40. The circuit structure of the re-constructable circuit 6 is switched by transition of the structure switching signal 60.

For example, if the structure switching signal 60 is at 1, the circuit structure is switched to a structural plane (1), whereas, if the structure switching signal 60 is at 2, the circuit structure is switched to a structural plane (2).

The backup operation 51 in this case is as follows. If the structure switching signal 60 is switched from 1 to 2, data of the structural plane (1) is retreated to a portion of the memory 10 for the structural plane (1), while data of the structural plane (2) is restored from a portion of the memory 10 for the structural plane (2) to the data holding circuit 11.

If the structure switching signal 60 is switched from 2 to 1, data of the structural plane (2) is retreated to the portion of the memory 10 for the structural plane (2), while data of the structural Plane (1) is restored from the portion of the memory 10 for the structural plane (1) to the data holding circuit 11.

In this manner, data in the data holding circuit 11 is retreated to the memory 10 as the original status, simultaneously with switching of the circuit structure, whilst data retreated to the memory 10 is returned (restored) to the data holding circuit 11.

If, in the illustrative operation, shown in FIG. 7, the structural plane is switched in the order of (1)→(2)→(1), the internal data in the status of the initial structural plane (1) is saved in the memory 10 at the change (1) to (2), and is restored when again it assumes the structural plane (1).

Thus, if the circuit structure is switched by e.g., context switching, data in the data holding circuit 11 is restored to its original state when the circuit structure reverts to its original state.

By providing the memory 10 with the function of previously writing data, it is possible to determine (set) initial output data when the data holding circuit 11 such as flipflop starts its operation and when the circuit structure is switched over.

If the function of turning off the backup mode is provided as a function of the data holding circuit having the backup mechanism 1, data into the data holding circuit 11 is held unchanged even if the circuit structure is switched (over), so that the internal data is directly used in the next circuit configuration.

Instead of setting the high state of the backup mode signal at all times during the backup mode, the backup mode signal can be set to high only before and after changing of the structure switching signal 60.

Thus, only the data holding circuit 11 is ordinarily in operation and, only directly before switching of the circuit structure, data is retreated to the memory 10 and the data is restored from the memory 10 only directly after the switching over. This diminishes the power consumption otherwise caused if the retreating/restoring operation to or from the memory 10 is continually performed.

A sixth embodiment of the present invention is hereinafter explained. FIG. 8 shows a block diagram of a data holding circuit having a backup mechanism according to the sixth embodiment of the present invention.

A selector 80 is inserted into a portion of the data holding circuit having a backup mechanism for restoring the data from the memory 10 to the data holding circuit 11 to enable selection of restored data.

In the configuration shown in FIG. 4 and in the operation shown in the timing chart in FIG. 7, data is retreated and restored only to the inside of the memory 10 contained in the data holding circuit having the backup mechanism 1.

However, this enables restoration of saved data only to the data holding circuit to which the data has been retreated.

Thus, if, as shown in FIG. 8, the selector 80 is inserted between the memory 10 and the data holding circuit 11, data saved in a given data holding circuit 11 can be restored to and used by another data holding circuit 11 i.e., any one or more of the other data holding circuits. This achieves data transfer between different data holding circuits.

It is also possible to insert a selector in the retreating signal line to select the storage elements into which data is to be restored. In this case, however, the circuit structure and control become more complex. It is therefore more desirable to insert the selector in the restoration signal line.

It is also possible to realize either data restoration for all the data holding circuits or optional data restoration between any combination of different data holding circuits. However, in view of the circuit volume and complexity, it is also possible to limit the possible combinations.

As a modification of the embodiment shown in FIG. 8, the memory 10 and the selector 80 can be combined or unified together to implement the data holding circuit having a backup mechanism by plural data holding circuits 11 and a multi-port memory.

A seventh embodiment of the present invention is hereinafter explained. FIG. 9 shows a circuit structure of a data holding circuit having a backup mechanism according to the seventh embodiment of the present invention. In the present embodiment, a backup mechanism is added to a non-synchronous data holding circuit.

Referring to FIG. 9, showing the seventh embodiment of the present invention, a transfer gate 90 is added to the configuration of the second embodiment and is control led by the backup mode signal 20 to eliminate collision of an output of the tri-state inverter 25 against the data input 12.

In this case, the output of the tri-state inverter 24 may collide against the data inputting signal 12. However, this problem can be overcome by lowering the driving capability of the tri-state inverter 24 to a value barely holding data, thereby placing priority on driving by the data input 12.

In this configuration, the backup mode signal 20 is normally at a low level and the backup mode signal 20 is set to a high level only when retreating and restoration of the internal status of the data holding circuit are required to effect the retreating and restoration operations.

The meritorious effects of the present invention are summarized as follows.

As described above, the present invention gives a meritorious effect that plural internal status of the data holding circuit can be retreated and restored.

According to the present invention, the circuit user is able to retreat and restore the internal status automatically without becoming conscious, whilst the circuit user is able to retreat and restore the internal status only when he or she desires.

According to the present invention, it is possible to select and restore one or more of retreated internal status.

According to the present invention, it is also possible to restore the internal status to a data holding circuit different from the data holding circuit 11 into which data has been retreated. Thus, according to the present invention, data transfer between plural data holding circuits is achieved without providing excess circuits.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A process for data holding and retreating comprising:
   providing a data holding circuit comprising a data holding portion and a memory portion,
   retreating at least one internal state of said data holding portion to said memory portion, and
   said internal state retreated to said memory portion is restored from said memory portion to said data holding portion.
2. The process as defined in claim 1, wherein said data holding portion holds one-bit data.
3. The process as defined in claim 1, wherein said data holding portion comprises a flipflop circuit.
4. The process as defined in claim 1, wherein
   said a data holding portion comprises a flipflop circuit, and
   wherein a state of a flipflop on a master side or a flipflop on a slave side is retreated to said memory portion, and
   a state retreated to said memory portion is restored from said memory portion to said data holding portion.
5. The process as defined in claim 1, wherein said data holding portion comprises a latch circuit.
6. The process as defined in claim 1, wherein said data holding portion is configured for holding data of plural bits and a multi-port memory portion, and
   wherein at least one internal state of said data holding portion is retreated to said memory portion, and
   said internal state retreated to said memory portion is restored from said memory portion to said data holding portion.
7. The process as defined in claim 1, wherein said data holding portion is configured as an asynchronous data holding portion which holds one-bit data.
8. The process as defined in claim 1, wherein said memory portion comprises a plurality of storage elements, and said storage elements are automatically determined depending on a state of a circuitry including said data holding portion.
9. The process as defined in claim 1, said memory portion comprises storage elements which are automatically determined depending on changes in the structure of a circuitry including said data holding portion.
10. The process as defined in claim 1, comprising
    retreating said internal state to said memory portion at a time point when the retreating of the internal state of the data holding portion is necessary.
11. The process as defined in claim 1 comprising:
    restoring said internal state from said memory portion at a time point when the restoration of the internal state of the data holding portion is necessary.
12. The process as defined in claim 1 comprising:
    selecting whether or not the retreating of the internal state of the data holding portion to said memory portion or restoration from said memory portion is to be made.
13. The process as defined in claim 1 comprising:
    retreating the internal state of said data holding portion to said memory portion in synchronism with clock signals and for restoring the internal state retreated to said memory portion to said data holding portion.
14. The process as defined in claim 13
    wherein control is performed so that a restoration operation from said memory portion and retreating to said memory portion will occur in high and low states of said clock signals, respectively.
15. The process as defined in claim 1
    wherein the restoration operation from said memory portion and retreating to said memory portion is caused to occur from cycle to cycle.
16. The process as defined in claim 1 further comprising:
    performing control so that the internal state of said data holding portion is retreated to said memory portion and for restoring the internal state retreated to said memory portion to said data holding portion only when the retreating and restoration operations are necessary.
17. The process as defined in claim 1 further comprising:
    selecting, from said memory portion, an internal state to be restored to said data holding portion among the internal states retreated to said memory portion.
18. The process as defined in claim 1, further comprising:
    restoring the internal state retreated to said memory portion to a data holding portion distinct from the data holding portion to which the data has been retreated.
19. The process as defined in claim 1
    wherein data is previously written in said memory portion and wherein
    the data stored in said memory portion is set in said data holding portion and on modifying a portion in use of said memory portion to determine an initial output value.

* * * * *